(12) United States Patent
Hung et al.

(10) Patent No.: US 6,770,934 B1
(45) Date of Patent: Aug. 3, 2004

(54) FLASH MEMORY DEVICE STRUCTURE AND MANUFACTURING METHOD THEREOF

(75) Inventors: Chih-Wei Hung, Hsin-chu (TW); Min-San Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/249,362

(22) Filed: Apr. 3, 2003

(51) Int. Cl.[7] .............................................. H01L 29/788
(52) U.S. Cl. ..................... 257/331; 257/315; 257/330
(58) Field of Search ............................... 257/314–326, 257/328–334

(56) References Cited

U.S. PATENT DOCUMENTS 4,929,988 A * 5/1990 Yoshikawa .................. 257/316
5,258,634 A * 11/1993 Yang ........................... 257/316

FOREIGN PATENT DOCUMENTS

JP          01291470 A   * 11/1989   .......... H01L/29/78

* cited by examiner

Primary Examiner—Long Pham
Assistant Examiner—Marcos D. Pizarro-Crespo
(74) Attorney, Agent, or Firm—Jiang Chyun IP Office (57) ABSTRACT

A flash memory device structure is provided. The flash memory device consists of a P-type substrate with an opening, a deep N-well region in the P-type substrate, a first gate structure and a second gate structure on the respective sidewalls of the opening, an insulating layer in the space between the first gate structure and the second gate structure, a source region in the P-type substrate at the bottom section of the opening, a drain region in the P-type substrate at the top section of the opening, a P-well region in the deep N-well region such that the junction between the P-well and the deep N-well region is at a level higher than the bottom section of the opening and a P-type pocket doping region in the P-type substrate on the sidewalls of the opening such that the P-type pocket doping region connects the P-well region with the source region.

15 Claims, 6 Drawing Sheets

FLASH MEMORY DEVICE STRUCTURE AND MANUFACTURING METHOD THEREOF

BACKGROUND OF THE INVENTION

1. Field of Invention

The present invention relates to a non-volatile memory (NVM) device. More particularly, the present invention relates to a flash memory device structure and manufacturing method thereof.

2. Description of Related Art

Flash memory is a memory device that allows multiple data writing, reading, and erasing operations. In addition, the stored data will be retained even after power to the device is removed. With these advantages, it has been broadly applied in personal computer and electronic equipment.

A typical flash memory device has a floating gate and a control gate fabricated using doped polysilicon. The control gate is set up above the floating gate with an inter-gate dielectric layer separating the two. Furthermore, a tunneling oxide layer is also setup between the floating gate and an underlying substrate (the so-called stack gate flash memory).

To write data into the flash memory, a bias voltage is applied to the control gate and the source/drain regions so that an electric field is set up to inject electrons into the floating gate. On the other hand, to read data from the flash memory, an operating voltage is applied to the control gate. Since the entrapment of charges inside the floating gate will directly affect the opening or closing of the underlying channel, the opening or closing of the channel can be construed as a data value of "1" or "0". Finally, to erase data from the flash memory, the relative potential between the substrate and the drain (source) region or the control gate is raised. Hence, tunneling effect can be utilized to transfer electrons from the floating gate to the substrate or drain (source) via the tunneling oxide layer (the so-called substrate erase or drain (source) side erase) or from the floating gate to the control gate via the inter-gate dielectric layer.

Figure 1:
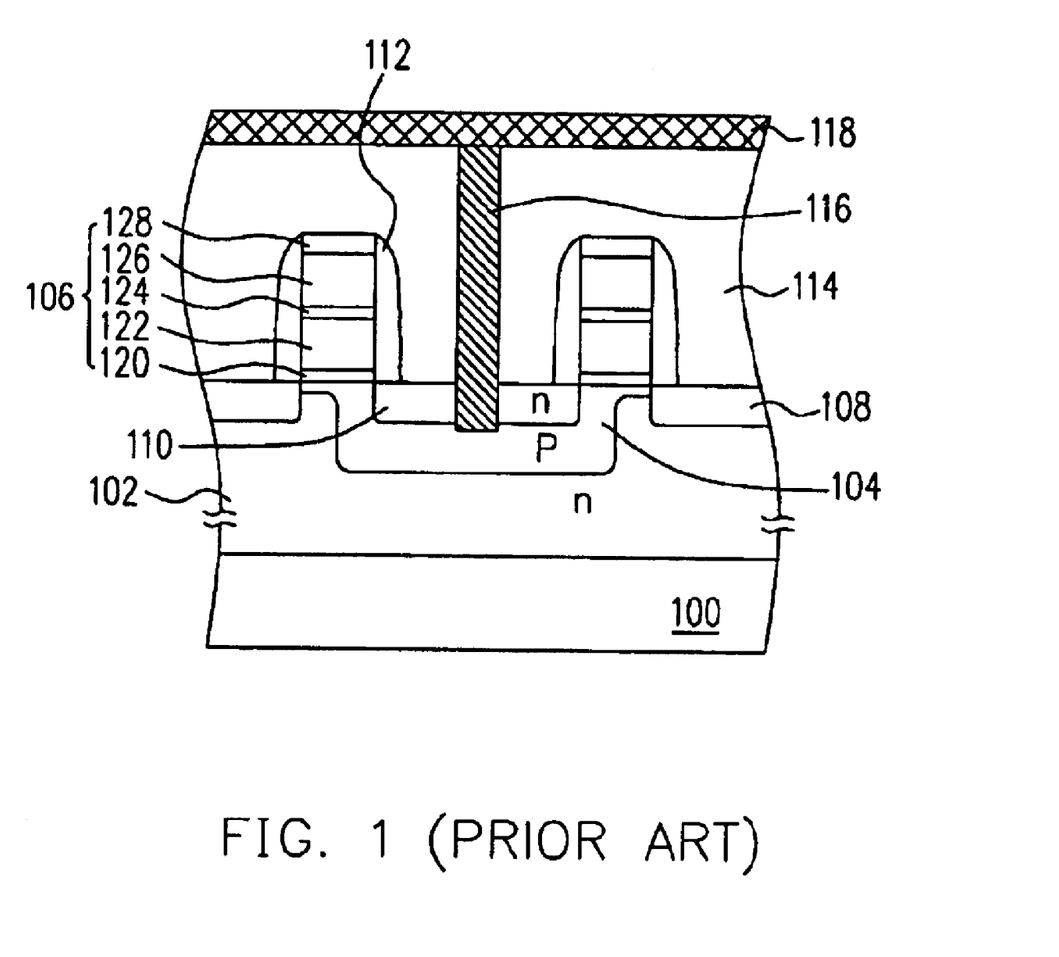
FIG. 1 is a schematic cross-sectional view of the stack gate structure of a conventional flash memory.

FIG. 1 is a schematic cross-sectional view of the stack gate structure of a conventional flash memory (according to U.S. Pat. No. 6,214,668). As shown in FIG. 1, the flash memory comprises of a P-type substrate 100, a deep N-well region 102, a P-well region 104, a stack gate structure 106, a source region 108, a drain region 110, spacers 112, an inter-layer dielectric layer 114, a contact 116 and a conductive line 118. The deep N-well region 102 is embedded within the P-type substrate 100 and the stack gate structure 106 is set up over the P-type substrate 100. The stack gate structure 106 furthermore comprises a tunneling oxide layer 120, a floating gate 122, an inter-gate dielectric layer 124, a control gate 126 and a gate cap layer 128. The source region 108 and the drain region 110 are located within the P-type substrate 100 on each side of the stack gate structure 106. The spacers 112 are attached to the sidewalls of the stack gate structure 106. The P-type well region 104 is within the deep N-well region 102 and extends from the drain region 110 to the area underneath the stack gate structure 106. The inter-layer dielectric layer 114 is above the P-type substrate 100. The contact 116 passes through the inter-layer dielectric layer 114 and the P-type substrate 100 and short-circuits the drain region 110 and the P-type well region 104. The conductive line 118 is positioned over the inter-layer dielectric layer 114 but is electrically connected to the contact 116.

However, as the level of integration of integrated circuits increases and the miniaturization of devices continues, some problems arise. For example, in order to increase the level of integration of a memory device, dimension of each flash memory cell must be reduced. One method of reducing overall memory cell dimension is to shorten the gate length and the separation between data lines. However, reducing the gate length will shorten the channel layer underneath the tunneling oxide layer 120 rendering an electric punch-through between the drain region 110 and the source region 108 more probable. Should such electrical punch-through occur within the device, electrical performance of the memory cell will be seriously compromised. In addition, the photolithographic process used for fabricating the flash memory also has the so-called critical dimension problem, thereby setting a lower limit to the ultimate cell dimension. Furthermore, the drain region 110 and the P-well region 104 are short-circuited together and the P-type well region 104 extends from the drain region 110 into the area underneath the stack gate structure 106. Hence, the P-type well region 104 may not have sufficient thickness in the lateral direction to enclose the drain region (N+ doped). When the memory cell is programmed, the source region receives a voltage of about 6V so that the drain region is at 0V. With this voltage setup, a NPN junction may break down leading to some adverse effect on a nearby flash memory cell. Thus, the ultimate level of integration in a conventional flash memory structure is severely limited.

SUMMARY OF THE INVENTION

Accordingly, one object of the present invention is to provide a flash memory device structure and manufacturing process thereof capable of preventing punch-through between a source region (at 6V) and a drain region (at 0V) while performing a programming operation. In the meantime, the level of integration of the memory device is also increased.

To achieve these and other advantages and in accordance with the purpose of the invention, as embodied and broadly described herein, the invention provides a flash memory device structure. The flash memory device structure comprises a first conductive type substrate, a second conductive type first well region, a tunnel dielectric layer, a first floating gate, a second floating gate, an inter-gate dielectric layer, a first control gate, a second control gate, an insulating layer, a spacer, a source region, a drain region, a first conductive type second well region and a first conductive type pocket doping region. The first conductive type substrate has an opening and the second conductive type first well region is embedded within the first conductive type substrate. The tunnel dielectric layer covers the bottom area as well as the sidewalls of the opening. The first floating gate and the second floating gate are attached to the respective tunnel dielectric layer on the sidewalls of the opening. The inter-gate dielectric layer is set up over the first floating gate and the second floating gate. The first control gate and a second control gate are set up over the first conductive type substrate. The first control gate extends to cover the sidewall of the first floating gate and the second control gate extends to cover the sidewall of the second floating gate. The insulating layer is positioned within the space between the first control gate and the second control gate. The spacer is attached to the sidewall of the first control gate and the second control gate respectively. The source region is set up within the first conductive type substrate at the bottom section of the opening. The drain region is set up within the first conductive type substrate just below the spacer. The first conductive type second well region is set up within the second conductive type first well region and that the junction between the first conductive type second well region and the second conductive type first well region is higher than the bottom section of the opening. The first conductive type pocket doping region is set up within the first conductive type substrate adjacent to the opening sidewalls and the first conductive type pocket doping region is connected to the first conductive type second well region and the source region.

In the aforementioned structure, the drain region and the first conductive type second well region are electrically short-circuited together. The electrical short-circuit is achieved through a contact that passes through the junction between the drain region and the first conductive type second well region. Furthermore, the structure further comprises an inter-layer dielectric layer over the first conductive type substrate and a conductive line over the inter-layer dielectric layer. The conductive line is electrically connected to the contact.

In the flash memory device structure of this invention, the gate structure (the tunnel dielectric layer, the floating gate, the inter-gate dielectric layer and the control gate) is set up on the sidewalls of the opening within the first conductive type substrate. Furthermore, the drain region and the source region are set up within the first conductive type substrate near the top section and the bottom section of the opening respectively. The channel region is set up within the P-type substrate (a vertical channel region) on the sidewall of the opening. By controlling depth of the opening, a channel having a desired length can be precisely manufactured. Hence, channel length reduction due to miniaturization is prevented and overall level of integration is increased.

This invention also provides a method of fabricating a flash memory device. First, a first conductive type substrate is provided. The substrate has a second conductive type first well region therein. A liner layer and a mask layer are sequentially formed over the substrate. The mask layer, the liner layer and the substrate are sequentially patterned to form an opening in the substrate. A tunnel dielectric layer is formed over the interior surface of the opening. Thereafter, a first conductive type pocket doping region is formed in the substrate next to the opening sidewalls. A first floating gate and a second floating gate are formed on the sidewalls of the opening and then a source region is formed at the bottom section of the opening. An inter-gate dielectric layer is formed over the interior surface of the opening. A first control gate and a second control gate are formed on the sidewalls of the opening. The first control gate extends to cover the sidewall of the first floating gate and the second control gate extends to cover the sidewall of the second floating gate. Next, the mask layer and the liner layer are removed and then a drain region is formed within the substrate. A first conductive type second well region is formed within the second conductive type first well region. The junction between the first conductive type second well region and the second conductive type first well region is at a higher level than the bottom section of the opening. An insulating layer is formed in the space between the first control gate and the second control gate. First spacers are formed on the sidewalls of the first control gate and the second control gate. After forming an inter-layer dielectric layer over the substrate, a contact is formed within the inter-layer dielectric layer. The contact forms a short circuit connection between the drain region and the first conductive type second well region. Finally, a conductive line is formed over the inter-layer dielectric layer so that the conductive line and the contact are electrically connected.

In the aforementioned method of fabricating the flash memory device, the step of forming the first floating gate and the second floating gate adjacent to the sidewalls of the opening is carried out before forming a first conductive layer that fills the opening. Thereafter, a portion of the first conductive layer is removed so that the upper surface of the first conductive layer is at a level slightly lower than the upper surface of the substrate and then second spacers are formed on the sidewalls of the mask layer. Using the mask layer and the second spacers as a mask, part of the first conductive layer is removed to form the first floating gate and the second floating gate. Finally, the second spacers are removed.

In the aforementioned method of fabricating the flash memory device, the step of forming the first control gate and the second control gate adjacent to the sidewalls of the opening is carried out before forming a second conductive layer that fills the opening. Thereafter, a portion of the second conductive layer is removed so that the upper surface of the second conductive layer is at a level lower than the upper surface of the mask layer but higher than the floating gate. Third spacers are formed on the sidewalls of the mask layer. Using the mask layer and the third spacers as a mask, part of the second conductive layer is removed to form the first control gate and the second control gate. Finally, the third spacers are removed.

The gate structure (including the tunnel dielectric layer, the floating gate, the inter-gate dielectric layer and the control gate) of this invention is formed inside the substrate adjacent to the sidewalls of the opening. In addition, the drain region and the source region are formed in the substrate around the top section and the bottom section of the opening respectively. The channel region is formed within the substrate parallel to the sidewalls of the opening (a perpendicular channel region). By controlling depth of the opening, a channel having a desired length can be precisely manufactured. Hence, channel length reduction due to miniaturization is prevented and overall level of integration is increased.

Furthermore, the floating gates and the control gates are formed by forming spacers over the mask layer and then etching the conductive layer using the spacers and mask layer as an etching mask. Since the fabrication process does not require photolithographic technique, process window is increased and process cost is reduced.

Because the entire gate structure has a vertical orientation, lateral NPN breakdown is prevented when the P-type well region is formed. In addition, unlike conventional BiNOR gate memory cell that requires good NPN isolation and hence demands a lateral drive-in for the P-type well region to increase the NPN range, no lateral drive-in is required in this invention. In other words, deterioration of quality at the interface between the inter-gate dielectric layer (oxide/nitride/oxide ONO) and the tunneling oxide layer due to thermal treatment can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A to 3H are schematic cross-sectional views showing the steps for fabricating a flash memory cell according to one preferred embodiment of this invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 2:
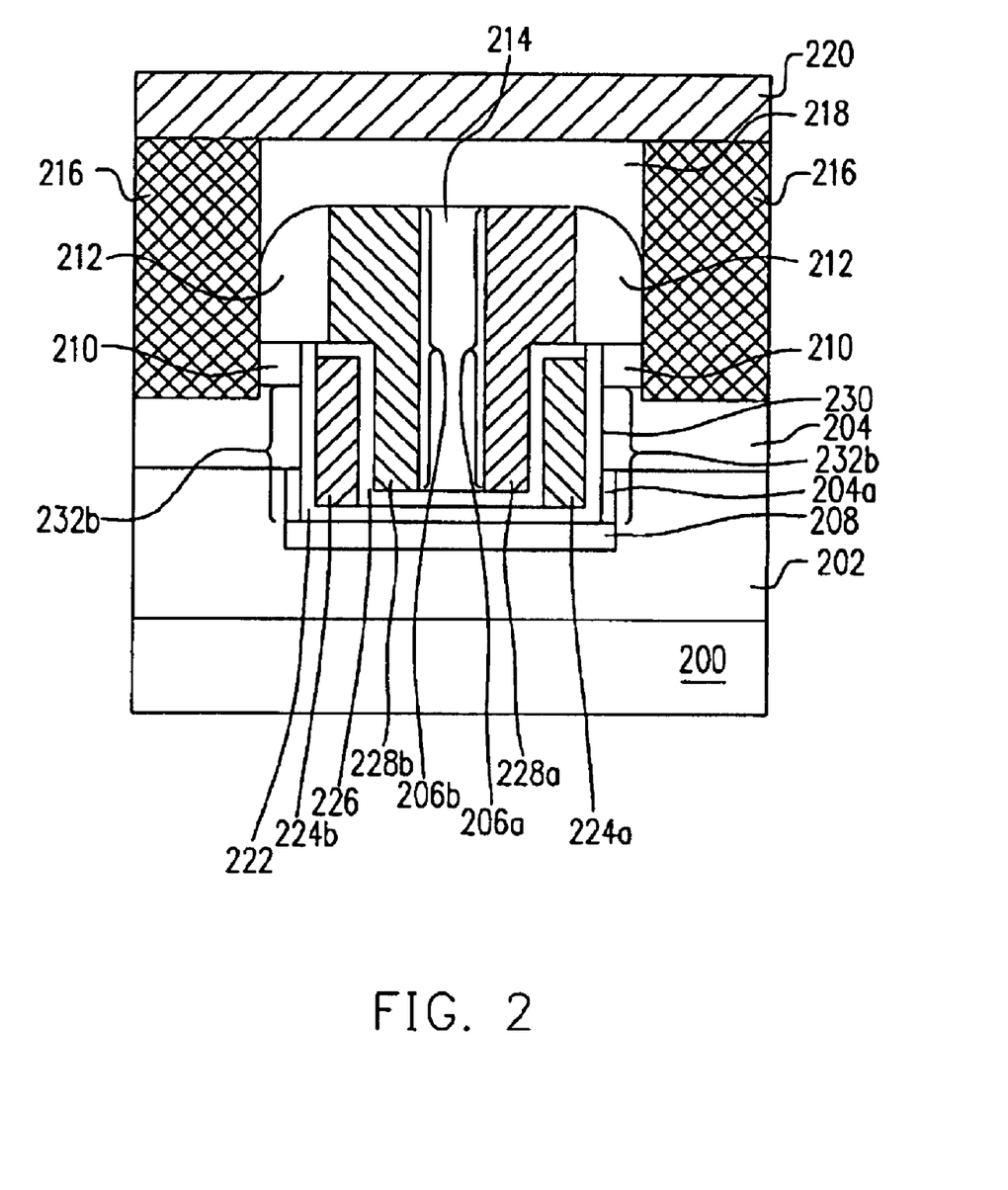
FIG. 2 is a schematic cross-sectional view of a flash memory cell according to one preferred embodiment of this invention.

FIG. 2 is a schematic cross-sectional view of a flash memory cell according to one preferred embodiment of this invention. As shown in FIG. 2, the flash memory cell comprises a P-type substrate 200, a deep N-well region 202, a P-well region 204, a pocket doping region 204a, a first gate structure 206a, a second gate structure 206b, a source region 208, a drain region 210, spacers 212, an insulating layer 214, contacts 216, an inter-layer dielectric layer 218 and a conductive line 220. The first gate structure 206a further comprises a tunnel dielectric layer 222, a floating gate 224a, an inter-gate dielectric layer 226 and a control gate 228a. Similarly, the second gate structure 206b further comprises the tunnel dielectric layer 222, a floating gate 224b, the inter-gate dielectric layer 226 and a control gate 228b.

The P-type substrate 200 has an opening 230. The deep N-well region 202 is embedded within the P-type substrate. The first gate structure 206a and the second gate structure 206b are set next to the sidewalls of the opening 230. The tunnel dielectric layer 222 is set to cover the bottom section and the sidewall section of the opening 230. The floating gates 224a and 224b are attached to the tunnel dielectric layer 222 on the respective sidewalls of the opening 230. The inter-gate dielectric layer 226 is set over the floating gates 224a and 224b. The control gates 228a and 228b are positioned within the opening 230 above the P-type substrate 200. The control gate 228a extends to cover the sidewall of the floating gate 224a and the control gate 228b extends to cover the sidewall of the floating gate 224b. The insulating layer 214 is set within the space between the first gate structure 206a and the second gate structure 206b. The spacers 212 are set next to the sidewall of the control gates 228a and 228b respectively. The source region 208 is set within the P-type substrate 200 at the bottom of the opening 230 and the drain region 210 is set up in the P-type substrate 202 underneath the spacer 212. The P-well region 204 is set within the deep N-well region 202 with the junction between the P-well region 204 and the deep N-well region 202 at a level higher than the bottom section of the opening 230. The P-type pocket doping region 204a is set up in the P-type substrate 200 on the sidewall of the opening 230. The upper and the lower surface of the P-type pocket doping region 204a are in contact with the P-well region 204 and the source region 208 respectively. The inter-layer dielectric layer 218 is set over the P-type substrate 200. The contact 216 is set under the inter-layer dielectric layer 218. The contact 216 passes through the junction between the drain region 210 and the P-well region 204 such that the two are short-circuited together. The conductive line 220 is set over the inter-layer dielectric layer 218 and the conductive line 220 and the contact 216 are electrically connected.

In the aforementioned embodiment of this invention, the first gate structure 206a and the second gate structure 206b are set up within the P-type substrate 200 next to the sidewall of the opening 230. Furthermore, the drain region 210 and the source region 208 are set up close to the top and bottom portion of the sidewall next to the opening 230. Hence, the channel regions 232a and 232b are set up within the P-type substrate just outside the opening 230 (a vertical channel region). By controlling depth of the opening, a channel having a desired length can be precisely manufactured. Hence, channel length reduction due to miniaturization is prevented and overall level of integration is increased.

Figure 3A:
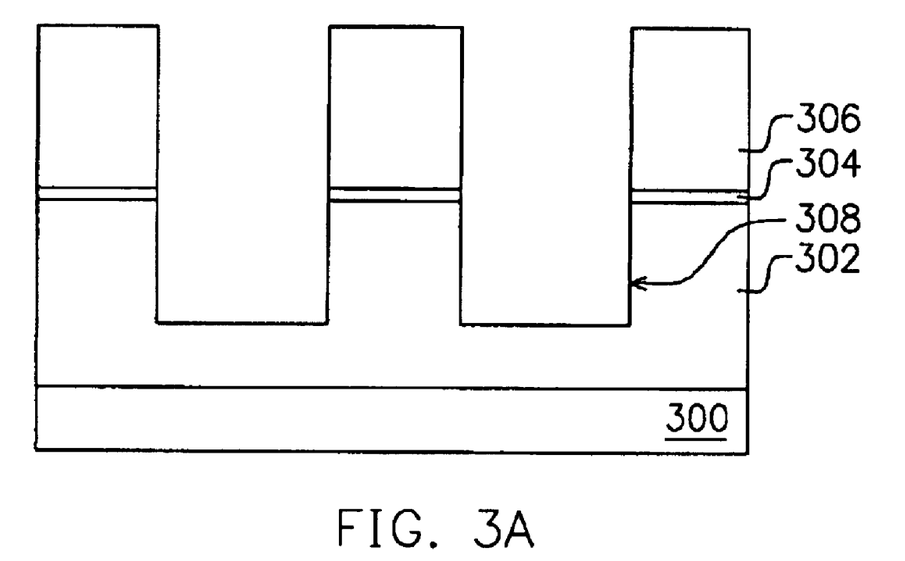

FIGS. 3A to 3H are schematic cross-sectional views showing the steps for fabricating a flash memory cell according to one preferred embodiment of this invention. First, as shown in FIG. 3A, a substrate 300 such as a P-type substrate with device isolation structure (not shown) therein is provided. The device isolation structure forms a pattern of lines that partitions the substrate 300 into active regions. The device isolation structures are field oxide layers formed by local oxidation (LOCOS) or shallow trench isolation (STI) structures. A deep N-well region 302 is formed within the P-type substrate 300 and then a liner layer 304 is formed over the P-type substrate 300. The liner layer 304 is, for example, a silicon oxide layer fabricated by performing a thermal oxidation process. Typically, the liner layer 304 has a thickness between about 100 Å to 150 Å. Thereafter, a mask layer 306 is formed over the liner layer 304. The mask layer 306 is, for example, a silicon nitride layer formed by chemical vapor deposition (CVD). The mask layer 306, the liner layer 304 and the substrate 300 are sequentially patterned to form an opening 308 in the substrate 300.

Figure 3B:
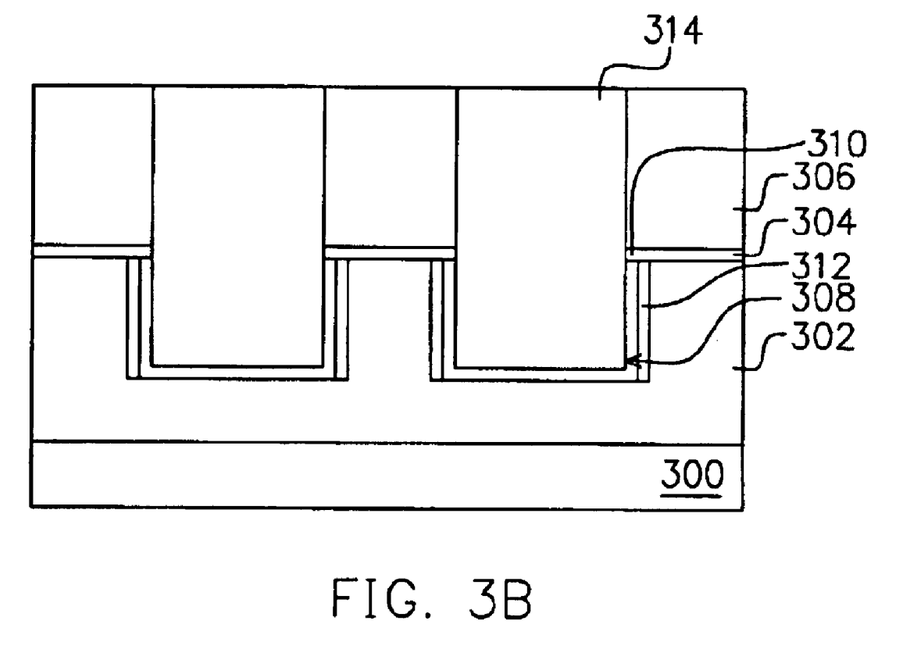

As shown in FIG. 3B, a tunnel dielectric layer 310 is formed over the bottom and sidewall section of the opening 308. The tunnel dielectric layer 310 is, for example, a silicon oxide layer formed by performing a thermal oxidation process. Typically, the tunnel dielectric layer 310 has a thickness between about 90 Å A to 100 Å. Next, dopants are implanted into the sidewalls of the opening 308 to form a pocket doping region 312. For example, dopants such as P-type ions at an implant energy level of between 30 to 50 KeV and a dosage of about $1 \times 10^{12}$ atoms/cm$^2$ are implanted into the sidewall at a slant angle between 15° to 30°. Thereafter, a conductive layer (not shown) that completely fills the opening 308 is formed over the substrate 300. The conductive layer is, for example, a doped polysilicon layer formed by performing a chemical vapor deposition process followed by an ion implantation. A portion of the conductive layer is removed, for example, by performing an etching back process to form a conductive layer 314 having an upper surface slightly lower than the upper surface of the substrate 300.

Figure 3C:
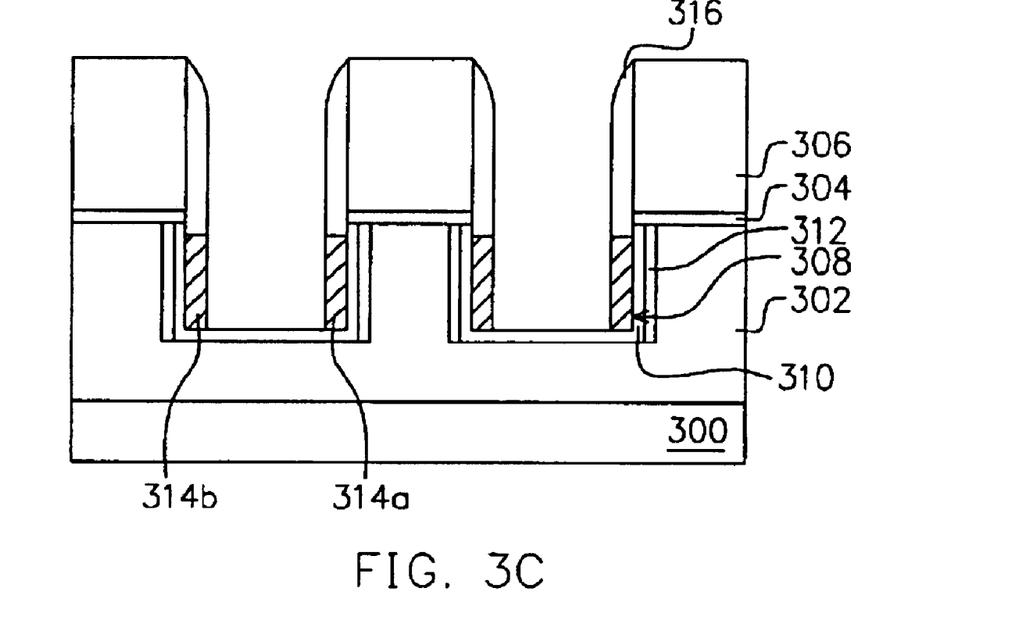

As shown in FIG. 3C, spacers 316 are formed on the sidewalls of the mask layer 306. The spacers 316 are fabricated using a material having an etching selectivity that differs from the conductive layer 314 including, for example, silicon oxide. The spacers 316 are formed, for example, by depositing insulating material over the substrate 300 to form an insulating layer (not shown) and then performing an anisotropic etching process to remove a portion of the insulating layer. Thereafter, using the mask layer 306 and the spacers 316 as an etching mask, the conductive layer 314 is etched to form conductive layers 314a and 314b on the sidewalls of the substrate 300. The conductive layers 314a and 314b serve as floating gates of the flash memory cell.

Figure 3D:
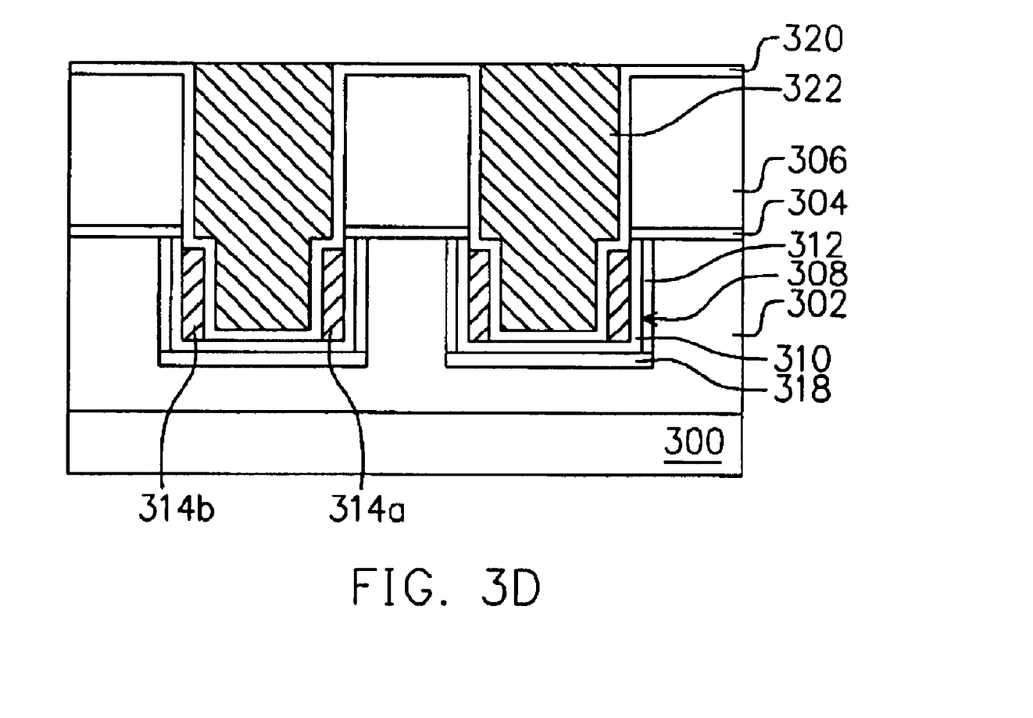

As shown in FIG. 3D, after removing the spacers 316, dopants are implanted into the substrate 300 at the bottom section of the opening 308 to form a source region 318. For example, dopants such as N-type ions with a dosage of about $4\times10^{15}$ atoms/cm$^2$ are implanted into the substrate 300. Thereafter, an inter-gate dielectric layer 320 is formed over the substrate 300. The inter-gate dielectric layer is, for example, a composite layer with a silicon oxide layer with a thickness of about 60 Å at the bottom, a silicon nitride layer with a thickness of about 70 Å in the middle and another oxide layer with a thickness of about 60 Å at the top. The inter-gate dielectric layer 320 is formed, for example, by performing a thermal oxidation process to form a silicon oxide layer and then performing a low-pressure chemical vapor deposition process to form a silicon nitride layer and another silicon oxide layer. Obviously, the inter-gate dielectric layer 320 can also be a silicon oxide layer or an oxide/nitride composite layer. Another conductive layer 322 is formed over the substrate. 300 that completely fills the opening 308. The conductive layer 322 is, for example, a doped polysilicon layer formed by performing a chemical vapor deposition process to form an undoped polysilicon followed by performing an ion implantation process.

Figure 3E:
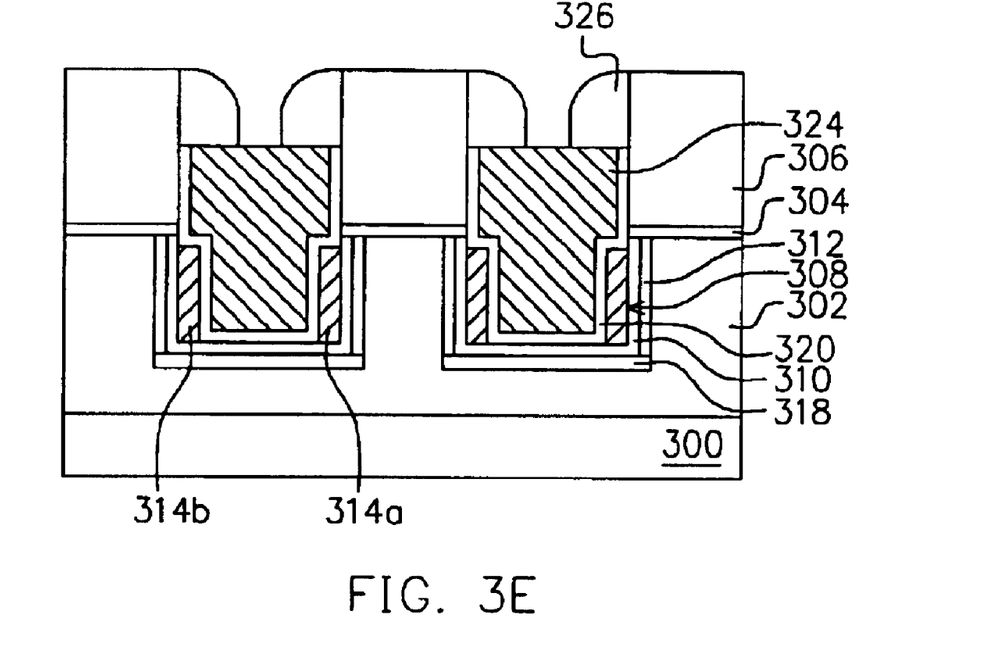

As shown in FIG. 3E, a portion of the conductive layer 322 is removed to form a conductive layer 324 having an upper surface below the upper surface of the upper surface of the mask layer 306 but above the upper surface of the substrate 300. The conductive layer 324 is formed, for example, by etching back the conductive layer 322. Thereafter, spacers 326 are formed on the sidewalls of the mask layer 306. The spacers 326 are fabricated using a material having an etching selectivity that differs from the conductive layer 324 including, for example, silicon oxide. The spacers 326 are formed, for example, by deposition insulating material over the substrate 300 to form an insulating layer (not shown) and removing a portion of the insulating layer by performing an anisotropic etching process.

Figure 3F:
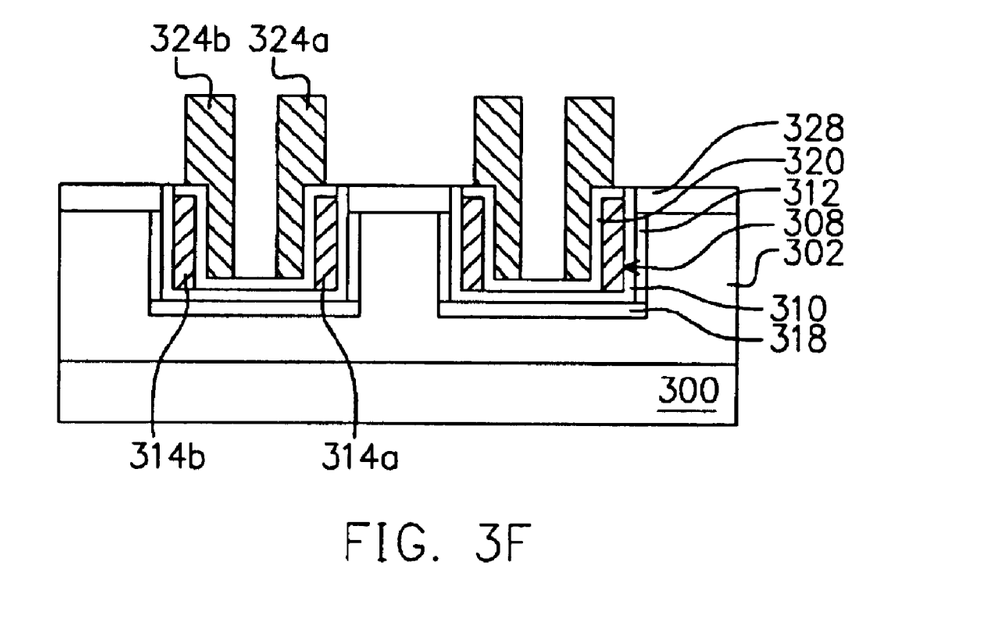

As shown in FIG. 3F, using the mask layer 306 and the spacers 326 as an etching mask, the conductive layer 324 is etched to form conductive layers 324a and 324b that extend to cover the sidewalls of the conductive layers 314a and 314b above the substrate 300. The conductive layers 324a and 324b serve as control gates of the flash memory cell. The conductive layer 324a, the inter-gate dielectric layer 320, the conductive layer 314a, the tunnel dielectric layer 310 together form a gate structure 325a. Similarly, the conductive layer 324b, the inter-gate dielectric layer 320, the conductive layer 314b and the tunnel dielectric layer 310 together form a gate another gate structure 325b. Thereafter, the spacers 326, the mask layer 306 and the liner layer 304 are removed, for example, by performing a wet etching process. Dopants are next implanted into the substrate 300 near the top section of the opening 308 to form a drain region 328. For example, dopants such as N-type ions at a dosage about $4\times10^{15}$ atoms/cm$^2$ are implanted into the substrate 300.

Figure 3G:
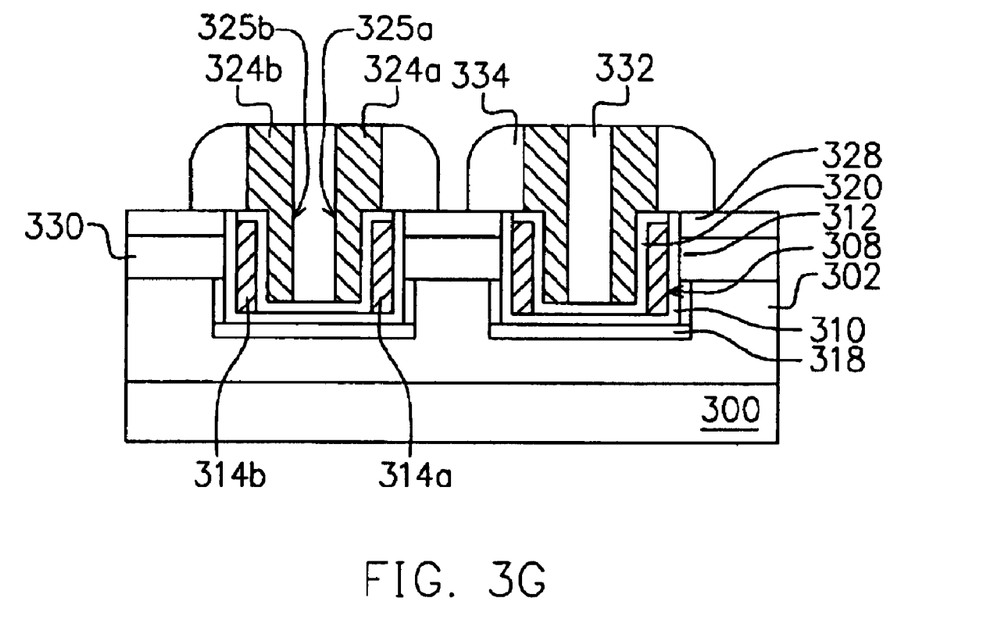

As shown in FIG. 3G, a P-well region 330 is formed inside the deep N-well region 302. The P-well region 330 is formed, for example, by implanting ions into the substrate at an implant dosage of about $1\times10^{13}$ atoms/cm$^2$. Thereafter, an insulating layer 332 is formed in the space between the conductive layers 324a and 324b and spacers 334 are formed on the sidewalls of the conductive layers 324a and 324b. The spacers 334 and the insulating layer 332 are formed, for example, by depositing insulating material over the substrate 300 and into the space between the conductive layers 324a and 324b to form an insulating material layer (not shown) and removing a portion of the insulating material layer in an anisotropic etching.

Figure 3H:
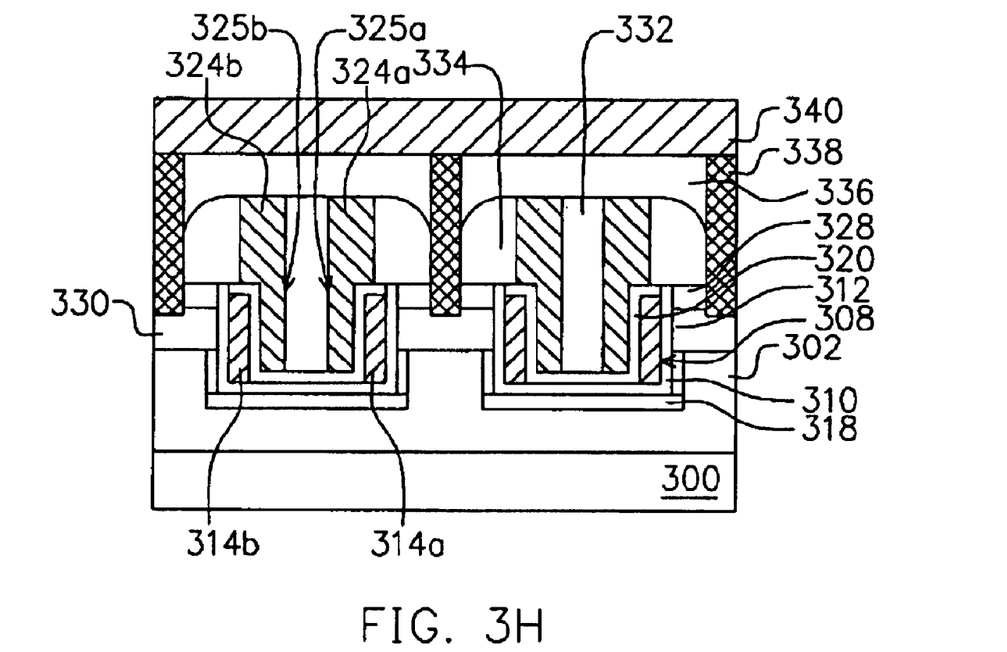

As shown in FIG. 3H, an inter-layer dielectric layer 336 is formed over the substrate 300. The inter-layer dielectric layer 336 is formed, for example, by performing a chemical vapor deposition process using a material including borophosphosilicate glass (BPSG) or phosphosilicate glass (PSG). A chemical-mechanical polishing is carried out to planarize the upper surface of the inter-layer dielectric layer 340. Thereafter, contacts 338 made from tungsten material, for example, are formed within the inter-layer dielectric layer 336. The contacts 338 pass through the junction between the drain region 328 and the P-well region 330 so that the drain region 328 and the P-well region 330 are short-circuited together. A conductive line 340 having electrical connection with the contacts 338 is formed over the inter-layer dielectric layer 336. The conductive layer 340 is formed, for example, by depositing conductive material over the substrate 300 to form a conductive layer (not shown) and then performing photolithographic and etching processes to form a pattern of linear conductive lines. Since subsequent processes for completing the fabrication of a flash memory cell should be familiar, detail descriptions of these steps are omitted here.

In this invention, the gate structures 325a and 325b are formed on the sidewalls of the opening 308 within the substrate 300. Furthermore, the drain region 328 and the source region 318 are formed in the substrate 300 close to the top and the bottom section of the opening 308. The channel region is set up within the substrate 300 just outside the opening 308 (a vertical channel region). By controlling depth of the opening, a channel having a desired length can be precisely manufactured. Hence, channel length reduction due to miniaturization is prevented and overall level of integration is increased.

Furthermore, the floating gates (the conductive layers 314a, 314b) are formed by forming spacers 316 over the mask layer 306 and then etching the conductive layer 314 using the spacers 316 and the mask layer 306 as an etching mask. Since the fabrication process does not require photolithographic technique, process window is increased and process cost is reduced. Similarly, the control gates (the conductive layers 324a, 324b) are formed by forming spacers 326 over the mask layer 306 and then etching the conductive layer 324 using the spacers 326 and the mask layer 306 as an etching mask. Again, process window is increased and process cost is reduced because photolithographic technique is not required.

Because the entire gate structure has a vertical orientation, lateral NPN breakdown is prevented when the P-type well region is formed. In addition, unlike conventional BiNOR gate memory cell that requires good NPN isolation and hence demands a lateral drive-in for the P-type well region to increase the NPN range, no lateral drive-in is required in this invention. In other words, deterioration of quality at the interface between the inter-gate dielectric layer (oxide/nitride/oxide ONO) and the tunneling oxide layer due to thermal treatment can be avoided.

It will be apparent to those skilled in the art that various modifications and variations can made to the structure of the present invention without departing from the scope of spirit of the invention. In view of the foregoing, it is intended that the present invention cover modifications and variations of this invention provided they fall within the scope of the following claims and their equivalents.

What is claimed is:

1. A flash memory device structure, comprising:
   a first conductive type substrate having an opening therein;
   a second conductive type first well region formed within the first conductive type substrate;

a tunnel dielectric layer formed on the sidewall and bottom section of the opening;

a first floating gate and a second floating gate formed on the tunnel dielectric layer on each side of the opening;

an inter-gate dielectric layer formed over the first floating gate and the second floating gate;

a first control gate and a second control gate formed over the substrate, wherein the first control gate extends to cover the sidewall of the first floating gate and the second control gate extends to cover the sidewall of the second floating gate;

an insulating layer formed in the space between the first control gate and the second control gate;

a spacer formed on the sidewalls of the first control gate and the second control gate;

a source region formed in the first conductive type substrate at the bottom section of the opening;

a drain region formed in the first conductive type substrate underneath the spacer;

a first conductive type second well region formed within the second conductive type first well region, wherein the junction between the first conductive type second well region and the second conductive type first well region is at a level higher than the bottom section of the opening; and a first conductive type pocket doping region formed within the first conductive type substrate on the sidewall of the opening, wherein the first conductive type pocket doping region connects the first conductive type second well region with the source region.

2. The flash memory device structure of claim 1, wherein the structure further more comprises:

an inter-layer dielectric layer formed over the first conductive type substrate; and a conductive line formed over the inter-layer dielectric layer and electrically connected with the contact.

3. The flash memory device structure of claim 1, wherein the inter-gate dielectric layer comprises an oxide/nitride/oxide composite layer.

4. The flash memory device structure of claim 1, wherein the drain region and the first conductive type second well region are electrically short-circuited together.

5. The flash memory device structure of claim 4, wherein the drain region and the first conductive type second well region are electrically short-circuited together through a contact that passes through the junction between the drain region and the first conductive type second well region.

6. A flash memory device structure, comprising:

a first conductive type substrate having an opening therein;

a second conductive type first well region formed within the first conductive type substrate;

a first gate structure and a second gate structure formed on the sidewalls of the opening;

an insulating layer formed in the space between the first gate structure and the second gate structure;

a source region formed in the first conductive type substrate close to the bottom section of the opening;

a drain region formed in the first conductive type substrate close to the top section of the opening;

a first conductive type second well region formed within the second conductive type first well region, wherein the junction between the first conductive type second well region and the second conductive type first well region is at a level higher than the bottom section of the opening; and a first conductive type pocket doping region formed within the first conductive type substrate on the sidewall of the opening, wherein the first conductive type pocket doping region connects the first conductive type second well region with the source region.

7. The flash memory device structure of claim 6, wherein the first conductive type substrate comprises a P-type substrate.

8. The flash memory device structure of claim 6, wherein the second conductive type first well region comprises a deep N-well region.

9. The flash memory device structure of claim 6, wherein the first conductive type second well region comprises a P-well region.

10. The flash memory device structure of claim 6, wherein the source region and the drain region comprises N-type ion doped region.

11. The flash memory device structure of claim 6, wherein the structure further more comprises:

an inter-layer dielectric layer formed over the first conductive type substrate; and a conductive line formed over the inter-layer dielectric layer and electrically connected with the contact.

12. The flash memory device structure of claim wherein the first gate structure and the second gate structure furthermore comprise:

a tunnel dielectric layer formed on the sidewalls of the opening;

a first floating gate and a second floating gate formed on the tunnel dielectric layer on each side of the opening;

an inter-gate dielectric layer formed over the first floating gate and the second floating gate; and a first control gate and a second control gate formed over the sidewalls of the first floating gate and the second floating gate respectively.

13. The flash memory device structure of claim 12, wherein the inter-gate dielectric layer comprises an oxide/nitride/oxide composite layer.

14. The flash memory device structure of claim 6, wherein the drain region and the first conductive type second well region are electrically short-circuited together.

15. The flash memory device structure of claim 14, wherein the drain region and the first conductive type second well region are electrically short-circuited together through a contact that passes through the junction between the drain region and the first conductive type second well.

* * * * *